United States Patent [19]

Maserjian

[11] Patent Number: 4,908,686
[45] Date of Patent: Mar. 13, 1990

[54] STACKED SILICIDE/SILICON MID- TO LONG-WAVELENGTH INFRARED DETECTOR

[75] Inventor: Joseph Maserjian, Goleta, Calif.

[73] Assignee: California Institute of Technology, Pasadena, Calif.

[21] Appl. No.: 226,754

[22] Filed: Aug. 1, 1988

[51] Int. Cl.[4] ............... H01L 29/48; H01L 31/10; H01L 27/14

[52] U.S. Cl. ......................... 357/30; 357/4; 357/15; 357/67

[58] Field of Search ............... 357/15, 4, 30, 67

[56] References Cited

U.S. PATENT DOCUMENTS

| | | | |
|---|---|---|---|
| 4,137,545 | 1/1979 | Becke et al. | 357/15 |
| 4,244,750 | 1/1981 | Chenevas Paule et al. | 357/15 |
| 4,492,971 | 1/1985 | Bean et al. | 357/15 |
| 4,544,939 | 10/1985 | Kosonocky et al. | 357/15 |
| 4,742,017 | 5/1988 | Bredthauer | 357/15 |
| 4,794,438 | 12/1988 | Levinson et al. | 357/15 |

OTHER PUBLICATIONS

Döhler, *Scientific American*, Nov. 1983 pp. 144–151, "Semiconductor Superlattices".
Dalal, *Jour. of Appl. Phys.* vol. 42 No. 3 May 1971, pp. 2274–2279 "Simple Model for Internal Photoemission".

*Primary Examiner*—Andrew J. James
*Assistant Examiner*—Jerome Jackson
*Attorney, Agent, or Firm*—Ashen Golant Martin & Seldon

[57] ABSTRACT

The use of stacked Schottky barriers (16) with epitaxially grown thin silicides (10) combined with selective doping (22) of the barriers provides high quantum efficiency infrared detectors (30) at longer wavelengths that is compatible with existing silicon VLSI technology.

10 Claims, 4 Drawing Sheets

Fig. 4a.
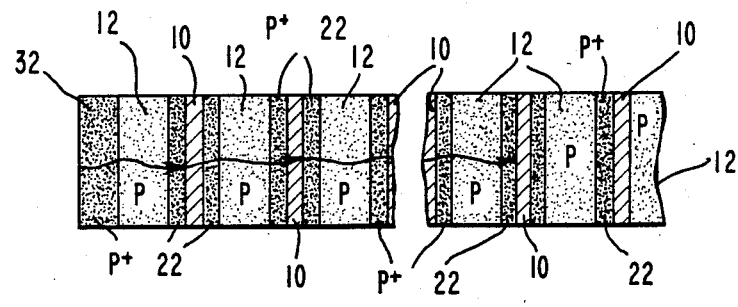
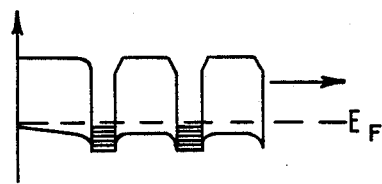
Fig. 4b.

STACKED SILICIDE/SILICON MID- TO LONG-WAVELENGTH INFRARED DETECTOR

ORIGIN OF INVENTION

The invention described herein was made in the performance of work under a NASA contract, and is subject to the provisions of Public Law 96-517 (35 U.S.C. 202) in which the Contractor has elected to retain title.

TECHNICAL FIELD

This invention relates to infrared detectors, and, more particularly, to an infrared detector useful in the mid-wavelength (MWIR) to long-wavelength (LWIR) infrared region, from a few to several micrometers.

BACKGROUND ART

Large infrared focal plane detector arrays have been developed (by industry) using Pt-silicide/silicon Schottky barriers as detector elements. These detector structures are compatible with silicon technology, allowing large monolithic detector arrays to be fabricated with extensive on-chip data processing. This major advantage is offset, however, by the marginal performance of the Schottky barrier detector elements, which are limited by their inherently low quantum efficiency ($\approx 1\%$). In addition, these detectors are limited by their Schottky barrier heights to cut-off wavelengths of not more than a few micrometers. Because of these limitations, alternate detector materials (e.g. HgCdTe), which require the use of hybrid technology, are being developed for longer wavelengths. However, such hybrid technology involves complex interconnections, which adversely impacts on device yield.

Accordingly, it is desired to extend the range of detectors compatible with monolithic silicon technology into the mid- to long-wavelength infrared region.

U.S. Pat. No. 4,544,939 by Kosonocky and Elabd offers some extension to longer wavelength response of Schottky barrier detectors by implanting a high concentration of dopant impurities in the Schottky barrier contact region of the semiconductor. An improved doping profile is incorporated in an embodiment of this invention.

It is also known according to V.L. Dalal, J. Appl. Phys., Vol. 42, pp. 2274-2279 (1971) that enhancement of internal photoemission occurs in very thin metal films of Schottky contacts if the thickness is less than the mean-free-path of the photoexcited carriers. Unfortunately, the absorption of light is reduced in such thin layers, thus reducing the total quantum efficiency of the detector. The present invention overcomes this limitation by incorporating multiple metal layers in a stacked configuration of Schottky barriers.

DISCLOSURE OF INVENTION

In accordance with the invention, a stacked configuration of silicide/silicon Schottky-barrier-type structures is provided for infrared detector arrays which: (1) is compatible with monolithic silicon technology; (2) can be tailored for mid- to long-wavelength response (e.g., $>5$ µm); and (3) provides high quantum efficiency (e.g., $>10\%$).

The stack configuration comprises a plurality of stacked silicon/metal silicide layers to form repeated Schottky barriers to increase the total absorption and thus the quantum efficiency. The metal silicide layers are made very thin to achieve optimum quantum efficiency per layer. The silicon layers are selectively doped, as with a doping spike, in the vicinity of the silicon/silicide Schottky barrier to alter the Schottky barrier sufficiently to permit tunneling of holes into silicon at energies below the barrier height. This lower energy results in an increased cut-off wavelength, thus extending the wavelength response to longer wavelengths.

BRIEF DESCRIPTION OF THE DRAWINGS

FIG. 4a is a cross-sectional view of a plurality of the structures depicted in FIG. 3;

FIG. 4b, on coordinates of energy and distance, is a plot depicting the energy profile of a portion of the device shown in FIG. 4a.

BEST MODES FOR CARRYING OUT THE INVENTION

Figure 1:
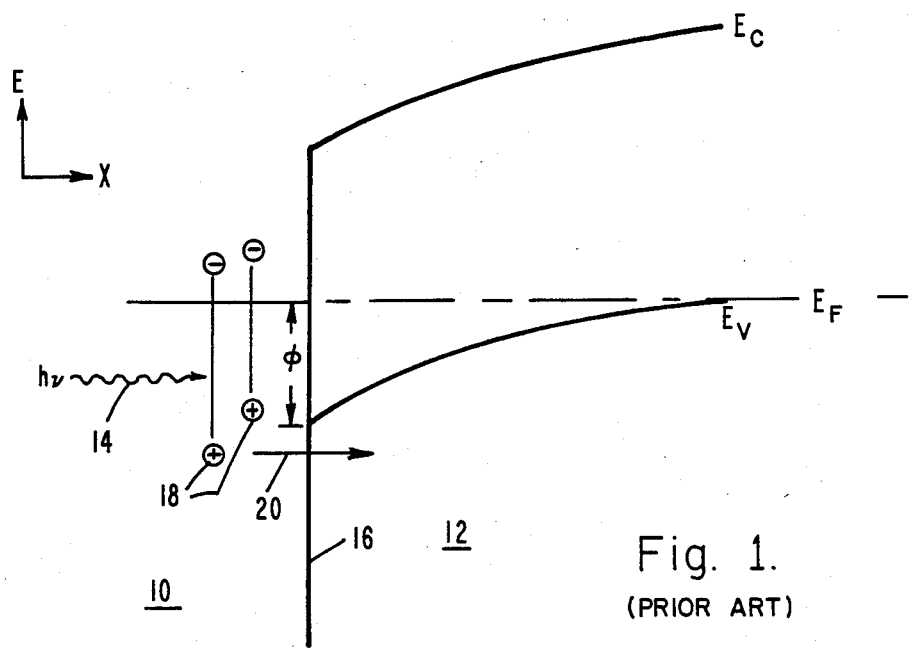
FIG. 1, on coordinates of energy and distance, is a plot depicting the operation of prior art Schottky-barrier detectors.

Normally, Schottky-barrier detectors work on the principle shown in FIG. 1. The metal contacts 10 in this illustration are usually either PtSi or Pd$_2$Si silicides (used by industry). These contacts form relatively low Schottky barriers to p-type silicon 12 providing near- to medium-wavelength infrared response. The barrier height is shown as $\phi$. $E_V$ and $E_C$ represent the valence band and the conduction band energy levels, respectively.

Photons (represented by wave 14) absorbed in the silicide 10 near the silicon interface 16 produce "hot" holes 18 with a maximum energy h$\nu$ (measured downward below the Fermi energy $E_F$). Holes with energy greater than $\phi$ (below $E_F$) can cross the barrier 14 (as indicated by arrow 20) and be collected in the silicon 12 as a photocurrent.

Since the maximum energy the hot holes can acquire is h$\nu$, the cut-off wavelength $\lambda_c$ is determined by h$\nu > \phi$, or $\lambda_c = 1.24/\phi$ (eV) µm. In this case, the barrier height $\phi$ (e.g., 0.25 eV) provides medium-wavelength cut-off (e.g., 5 µm). This limitation is overcome in the following embodiment.

Figure 2:
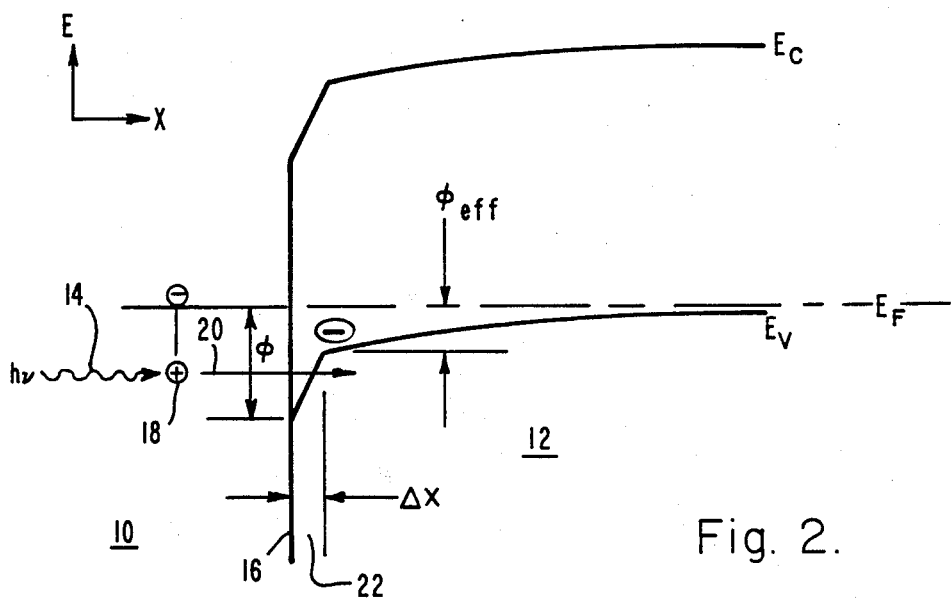
FIG. 2, on coordinates of energy and distance, is a plot depicting the operation of the Schottky-barrier detector of the invention and illustrating the concept of barrier engineering to achieve longer wavelength response.

FIG. 2 illustrates the concept of barrier engineering in accordance with the invention to achieve longer wavelength response. A dopant spike 22 is introduced adjacent the silicon/silicide interface 16. Since a low Schottky barrier height occurs at the valence band (as opposed to the larger barrier at the conduction band), the dopant is an acceptor impurity, typically boron. This spike may be introduced during growth of the stacked structure described below. By selecting the appropriate density per unit area $N_s$ and position $\Delta x$ for the dopant spike, the top portion of the Schottky barrier can be made sufficiently narrow so that holes can tunnel into the silicon at energies less than $\phi$, but above an effective value $\phi_{eff}$. Thus, the effective barrier is reduced from $\phi$ to $\phi_{eff}$, and the cut-off wavelength increases from $\lambda_c = 1.24/\phi$ to $\lambda_c = 1.24/\phi_{eff}$. The value of $\phi_{eff}$ is determined by Gauss's law $$\epsilon \Delta F = e N_s,$$

and $$\Delta F \approx (\phi - \phi_{eff})/\Delta x.$$

Thus, by appropriate choice of $N_s$ and $\Delta x$, the value of $\phi_{eff}$ can be determined. For example, if the layers are grown by molecular beam epitaxy (MBE), typical values might be $\phi - \phi_{eff} \approx 0.15$ eV, $\Delta x \approx 10$ Å, and $N_s \approx 10^{13}$ cm$^{-2}$. The p doping of the bulk silicon is kept sufficiently low (e.g. $10^{15}$ to $10^{16}$ cm$^{-3}$) so that tunneling is not appreciable through the residual barrier beyond $\Delta x$.

High quantum efficiency, on the order of 10% or more, is achieved by using very thin silicide layers and stacking layers of silicon and metal silicide to form repeated Schottky barriers. Such stacked structures could be epitaxially grown, for example, by molecular beam epitaxy (MBE) using silicides which are closely lattice-matched to silicon. CoSi$_2$ is an example of such a silicide in which Si/CoSi$_2$/Si structures have been epitaxially grown by MBE. Another familiar example is Si/NiSi$_2$/Si, and still others are being investigated.

Figure 3:
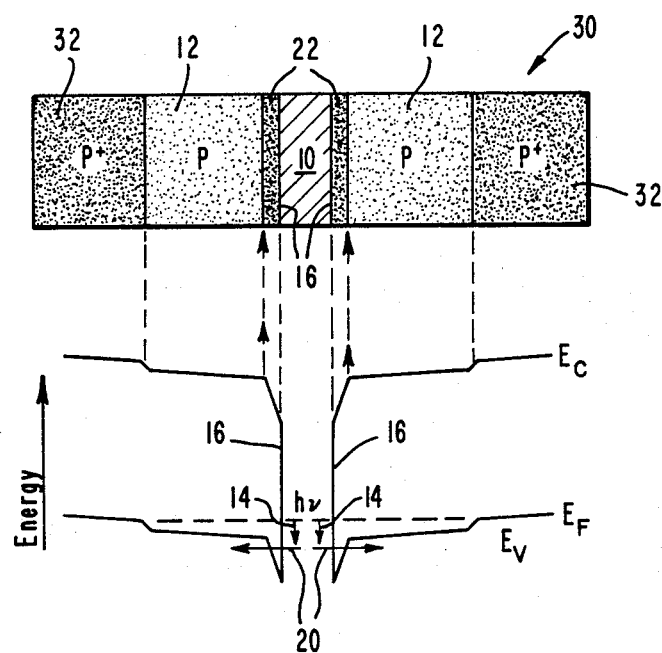
FIG. 3 is a cross-sectional view of a particular embodiment of one structure of a stack of such structures which comprise the detector of the invention.

FIG. 3 illustrates the detector configuration 30 of a single back-to-back Schottky element with selective doping of the Schottky barriers. Contact layers 32, conveniently comprising p+-doped silicon, are used to provide electrical contact to the device to detect the resulting photo currents. These p+ layers should be doped to at least about $10^{19}$ cm$^{-3}$ acceptors to provide sufficiently narrow Schottky barriers for ohmic contact.

The high quantum efficiency of the device of the invention is achieved by making the silicide layers 10 very thin, much less than the mean-free-path of the photo holes in the silicide. This thickness (e.g., < 10 nm) increases the probability that the photo holes can be collected at one of the Schottky barriers, since they can then make many attempts as they are repeatedly reflected elastically back and forth between the contacts before losing their energy by inelastic collisions. According to Dalal, supra, in the limit of thin metal films, the quantum yield increases approximately inversely with the metal thickness w when w is less than the effective scattering distance L. Therefore, if w/L < 1, an enhanced quantum efficiency per absorbed photon is gained. The photo holes are also collected at both interfaces, thus further doubling the quantum efficiency per layer.

Since each thin silicide layer 10 absorbs only the fraction $1 - \exp(-\alpha w) \approx \alpha w$ (for $\alpha w < 1$) of the incident IR radiation, where $\alpha$ is the metal absorption coefficient, the use of repeated layers increase the overall quantum efficiency. The silicon layers 12 are virtually transparent to the medium- and long-wavelengths. The silicon layers 12 each need only be thick enough to support the total depletion width of the two Schottky barriers (typically, about 1,000 to 2,000 Å). Ideally, the optimum number of layers N occurs when most of the IR radiation is absorbed, that is when $N\alpha w \gtrsim 1$. For example, if $\alpha \approx (200 \text{ Å})^{-1}$, $Nw \gtrsim 200$ Å.

While FIG. 3 depicts a single back-to-back Schottky-barrier structure comprising two silicon layers 12 sandwiching one metal silicide layer 10, many such sandwiched, or stacked, layers may be utilized, as shown in FIG. 4a. FIG. 4b depicts the energy profile of a portion of the device shown in FIG. 4a.

Figure 5:
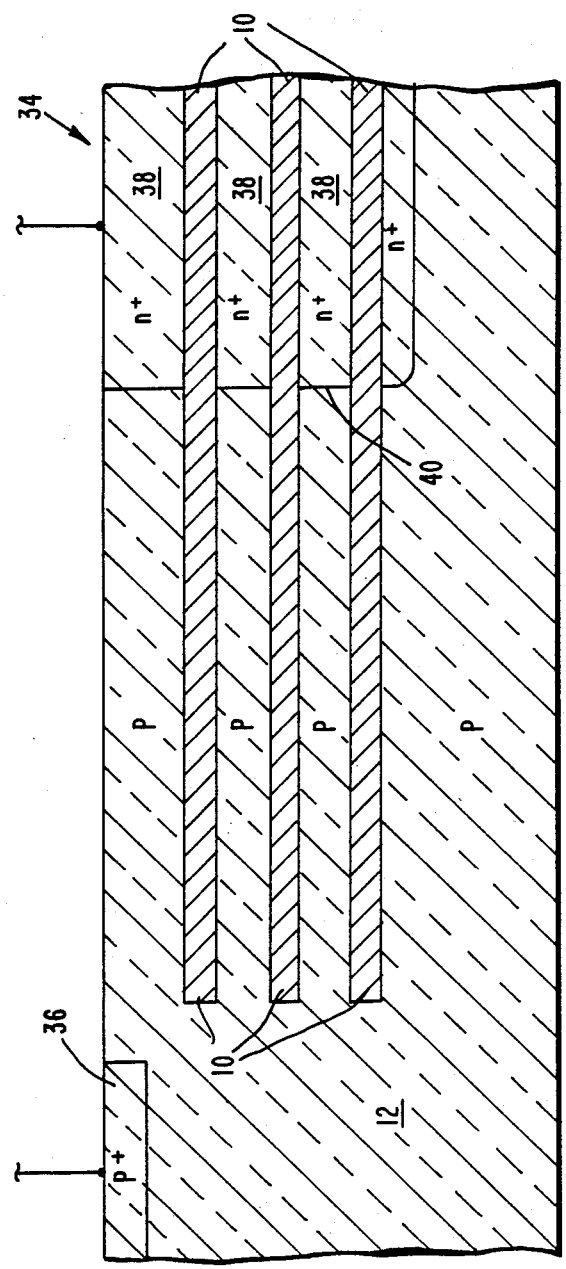
FIG. 5 is a cross-sectional view of a means of contacting each detector element, or pixel, of a stack.

Separate contacts to the metal silicide layers and n-silicon layers need to be provided at the sides of each detector element (pixel). One preferred configuration is schematically depicted in FIG. 5, showing one pixel 34. N+-silicon regions 38 make contact to the metal silicide layers 10 and p+-silicon regions 36 make contact to intervening p-silicon layers 12. The p-n junction 40 provides a sufficient electrical barrier such that contact regions 36 and 38 effectively connect only through the set of interleafing Schottky barriers between the p-silicon and metal silicide layers. The Schottky barriers are thus all connected in parallel, each contributing to the total photo current and quantum efficiency. These contact regions 36, 38 may in turn be connected to signal processing circuitry (not shown), for example, by metal contacts and wires. In order to achieve good contact to the detector p-silicon and metal silicide layers and to interconnects to the circuitry, the p+ and n+ doping should be sufficiently large (e.g., $N_A \approx N_D > 10^{19}$ cm$^{-3}$.

Various techniques are being developed for achieving configurations such as shown in FIG. 5, using, for example, during MBE growth in situ techniques such as ion beam writing of the dopants in the preferred regions and/or use of shadow masks. Alternately, one may use combinations of ion implantation, patterning, etching, and MBE regrowth.

Since the above structures can be grown by MBE, they could be grown directly on the same silicon wafers that are processed for VLSI circuits. In this case, the p+ or n+ contacts 36 and 38 shown in FIG. 5 may also be patterned to serve as internal interconnects to circuitry processed on the same silicon chip. Therefore monolithic silicon detector arrays with on-chip processing are possible.

INDUSTRIAL APPLICABILITY

The stacked silicide/silicon detector of the invention is useful in infrared detectors in which longer wavelength detection and higher quantum yield are required and in which monolithic silicon detectors with on-chip processing is desired.

Thus, a stacked silicide/silicon mid- to long-wavelength infrared detector is disclosed. It will be apparent to one of ordinary skill in the art that various changes and modifications may be made without departing from the spirit and scope of the invention, and all such changes and modifications are intended to fall within the scope of the invention, as defined by the appended claims.

What is claimed is:

1. An improved infrared detector comprising at least one unit comprising a thin single crystal metal silicide layer sandwiched between two single crystal silicon layers, each doped to a first doping level, each said silicon layer forming an interface with said silicide layer, the improvement comprising that portion of each said silicon layer adjacent said interface having a second doping level higher than that of said first doping level, thereby forming a reduced Schottky barrier.

2. The detector of claim 1 wherein said metal silicide layer is selected from the group of metal silicides that may be epitaxially grown on silicon, thereby forming a heteroepitaxial interface with said silicon.

3. The detector of claim 2 comprising a plurality of said units to form repeated Schottky barriers.

4. The detector of claim 2 wherein said metal silicide is selected from the group consisting of $CoSi_2$ and $NiSi_2$.

5. The detector of claim 1 wherein said metal silicide has a thickness ranging up to about 10 nm.

6. An improved infrared detector comprising a plurality of stacked metal silicide layers, each silicide layer sandwiched between two silicon layers, each doped to a first doping level, each said silicon layer forming an interface with an adjacent metal silicide layer to form repeated p-type Schottky barriers, the improvement comprising that portion of each said silicon layer adjacent said interface having a doping level higher than that of said first doping level, thereby providing a reduced effective barrier height.

7. The detector of claim 6 wherein said metal silicide is selected from the group consisting of metal silicides that may be epitaxially grown on silicon.

8. The detector of claim 7 wherein lateral contacts are provided to a plurality of layers by providing common $n^+$ contacting regions to the metal silicides and common $p^+$ contacting regions to the interleafing p-silicon layers.

9. The detector of claim 8 wherein said metal silicide is selected from the group consisting of $CoSi_2$ and $NiSi_2$.

10. The detector of claim 7 wherein said metal silicide has a thickness ranging up to about 10 nm.

* * * * *